United States Patent
Zheng et al.

(10) Patent No.: US 10,447,013 B2
(45) Date of Patent: Oct. 15, 2019

(54) HIGH-POWER PACKAGED LASER ARRAY

(71) Applicant: Axalume, Inc., Cayenne Creek Rd., CA (US)

(72) Inventors: Xuezhe Zheng, San Diego, CA (US); John E. Cunningham, San Diego, CA (US); Ashok V. Krishnamoorthy, San Diego, CA (US)

(73) Assignee: Axalume, Inc., San Diego, CA (US)

( * ) Notice: Subject to any disclaimer, the term of this patent is extended or adjusted under 35 U.S.C. 154(b) by 0 days.

(21) Appl. No.: 16/039,057

(22) Filed: Jul. 18, 2018

(65) Prior Publication Data

US 2019/0027901 A1 Jan. 24, 2019

Related U.S. Application Data

(60) Provisional application No. 62/534,208, filed on Jul. 19, 2017.

(51) Int. Cl.
| | |
|---|---|
| *H01S 5/40* | (2006.01) |
| *G02B 6/42* | (2006.01) |
| *G02B 19/00* | (2006.01) |
| *G02B 27/09* | (2006.01) |
| *H01S 5/00* | (2006.01) |

(52) U.S. Cl.
CPC .......... *H01S 5/4025* (2013.01); *G02B 6/4249* (2013.01); *G02B 6/4266* (2013.01); *G02B 19/0028* (2013.01); *G02B 19/0057* (2013.01); *G02B 27/0961* (2013.01); *H01S 5/4018* (2013.01); *H01S 5/005* (2013.01)

(58) Field of Classification Search
CPC .... H01S 5/0064; H01S 5/4031; H01S 5/1085; H01S 5/02252; H01S 5/02272; H01S 5/4025
See application file for complete search history.

(56) References Cited

U.S. PATENT DOCUMENTS

| | | | | |
|---|---|---|---|---|
| 5,264,392 | A * | 11/1993 | Gaebe | G02B 6/12004 257/E25.032 |
| 8,149,891 | B2 * | 4/2012 | Funabashi | G02B 6/42 372/50.1 |
| 10,146,020 | B1 * | 12/2018 | Yasumura | G02B 6/29316 |
| 2015/0098127 | A1 * | 4/2015 | Kurokawa | G02F 1/093 359/484.03 |

OTHER PUBLICATIONS

ECOC2014_WS1_Peter De Dobbelaere, "Light Source Approach for Silicon Photonics Transceivers," Proceedings European Conference on Optical Communications (ECOC), Sep. 2014, pp. 1-12.

* cited by examiner

*Primary Examiner* — Michael Carter
(74) *Attorney, Agent, or Firm* — Steven Stupp

(57) ABSTRACT

A high-power packaged laser array that is thermal reflow compatible is described. Notably, a high-power III-V laser array is integrated on a silicon substrate with a matching array of ball lenses, an isolator and a coupler (such as a reflective layer) to achieve an edge-coupled or a surface-normal output laser array. In some embodiments, an isolator with a permanent magnet is used to preserve the magnetic domain or state of the isolator during the thermal reflow(s), which can involve temperatures up to 250 C. In order to relax the misalignment tolerance when integrating with the silicon chip, a laser array with a larger optical mode may be used to increase the output beam size. Moreover, a III-V laser array with an angled output optical waveguide can be used to improve the stability of the lasers at high power.

20 Claims, 5 Drawing Sheets

HIGH-POWER PACKAGED LASER ARRAY

CROSS REFERENCE TO RELATED APPLICATIONS

This application claims priority under 35 U.S.C. 119(e) to U.S. Provisional Application Ser. No. 62/534,208, entitled "High-Power Packaged Laser Array," by Xuezhe Zheng and Ashok V. Krishnamoorthy, filed on Jul. 19, 2017, the contents of which are herein incorporated by reference.

BACKGROUND

Field

The present disclosure relates to techniques for packaging an optical source. More specifically, the present disclosure relates to a high-power packaged laser array.

Related Art

Silicon photonics is a promising platform for next generation optical interconnects that require large bandwidth, high density and high-power efficiency. Because a practical monolithic silicon light source has been difficult to achieve, to date hybrid approaches that integrate III-V materials onto silicon have been the primary focus. For example, in one approach, a packaged laser with a surface-normal output is actively aligned to a grating coupler on a silicon chip, which coupled the light into an optical waveguide on the silicon chip.

Nonetheless, integrating a III-V laser chip onto silicon remains challenging. Consequently, many approaches use an external laser with surface-normal coupling to minimizes the interruption to the process flow and to reduce the complexity of the integration. However, it can be difficult to integrate such a hybrid external laser with low cost and high yield.

SUMMARY

One embodiment of the present disclosure provides a packaged laser array. This packaged laser array includes a substrate. Moreover, the packaged laser array includes a laser array with one or more lasers disposed on a surface of the substrate, where, during operation, the laser array outputs one or more optical signals in a plane. Furthermore, the packaged laser array includes a lens array with one or more lenses disposed on the surface, where, during operation, the lens array refracts (such as focuses) the one or more optical signals. Additionally, the packaged laser array includes an isolator having a magnetization that rotates a polarization of the one or more optical signals, and one or more couplers that couple the one or more optical signals along a direction out of the substrate. The packaged laser array also includes a permanent magnet proximate (such as adjacent, e.g., within 1 mm) to the isolator that at least partially maintains a magnetization of the isolator.

Note that the packaged laser array may be designed to withstand reflow temperatures and thermal profiles associated with semiconductor packaging. (Thus, the packaged laser array may maintain its function during such reflow temperatures.) These could include, for example, include temperatures exceeding 180 C for 1-2 min, and peak temperatures in the range of 220-250 C.

The laser array may include an external laser array on a different substrate that the substrate, which is coupled to the surface of the substrate. In some embodiments, the laser array includes a III-V semiconductor laser array.

Moreover, the one or more lenses may include one or more ball lenses that are disposed in one or more corresponding pits in the surface.

Furthermore, the packaged laser array may include a half-wave plate between the isolator and the one or more couplers. Alternatively or additionally, the isolator may include a first polarizer having a first polarization axis, a polarization rotator that rotates the polarization, and a second polarizer having a second polarization axis that is different from the first polarization axis.

Additionally, the permanent magnet may maintain the magnetization of the isolator during thermal reflow at a temperature exceeding a threshold value (such as 200 C).

In some embodiments, the one or more optical signals have an optical beam size greater than a second threshold value (such as greater than 1-5 μm).

Moreover, the one or more lasers may have angled facets. In these embodiments, the lens array may be arranged with an angle corresponding the angled facets and the one or more couplers may be positioned based at least in part on the angled facets so that the one or more optical signals have approximately a common optical path length in the packaged laser array.

Furthermore, the one or more optical signals may have the same or different carrier or fundamental wavelengths.

Additionally, the one or more couplers may include one or more reflective layers that couple the one or more optical signals out of the plane (such as approximately perpendicular or normal to the plane). Alternatively, the one or more couplers may allow the laser array to work with an edge-coupled silicon photonic chip through an optical waveguide that terminates at an edge of the silicon photonic chip. In these embodiments, the lid may be transparent (e.g., silicon) so that the infrared light can pass through the lid. This approach may make the packaged laser array more compact because the reflective layer may not be needed.

Other embodiments provide an electronic device that includes a packaged laser array, such as the packaged laser array.

Other embodiments provide a system that includes an integrated circuit that is optically coupled to the packaged laser array, such as the packaged laser array.

Other embodiments provide a method for providing one or more optical signals, which may be performed by a packaged laser array, such as the packaged laser array.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

A high-power packaged laser array that is thermal reflow compatible is described. Notably, a high-power III-V laser array is integrated on a silicon substrate with a matching array of ball lenses, an isolator and a mirror (or, more generally, a reflective layer) to achieve a surface-normal output laser array. In some embodiments, an isolator with a permanent magnet is used to preserve the magnetic domain or state of the isolator during the thermal reflow(s), which can involve temperatures up to 250 C. In order to relax the misalignment tolerance when integrating with the silicon chip, a laser array with a larger optical mode may be used to increase the output beam size. Moreover, a III-V laser array with an angled output optical waveguide can be used to improve the stability of the lasers at high power.

This packaging technique may facilitate low-cost, high-yield integration of the packaged laser array. In addition to being thermal reflow compatible, the packaging technique may be less sensitive to misalignment and/or more facilitate stable high-power operation. Furthermore, the III-V laser array may be tested and selected before integration into the packaged laser array, which may help improve the yield and uniformity. Consequently, the packaging technique may enable increased communication performance in optical links that include the packaged laser array, such as silicon-photonic links, optical fibers, etc.

Figure 1:
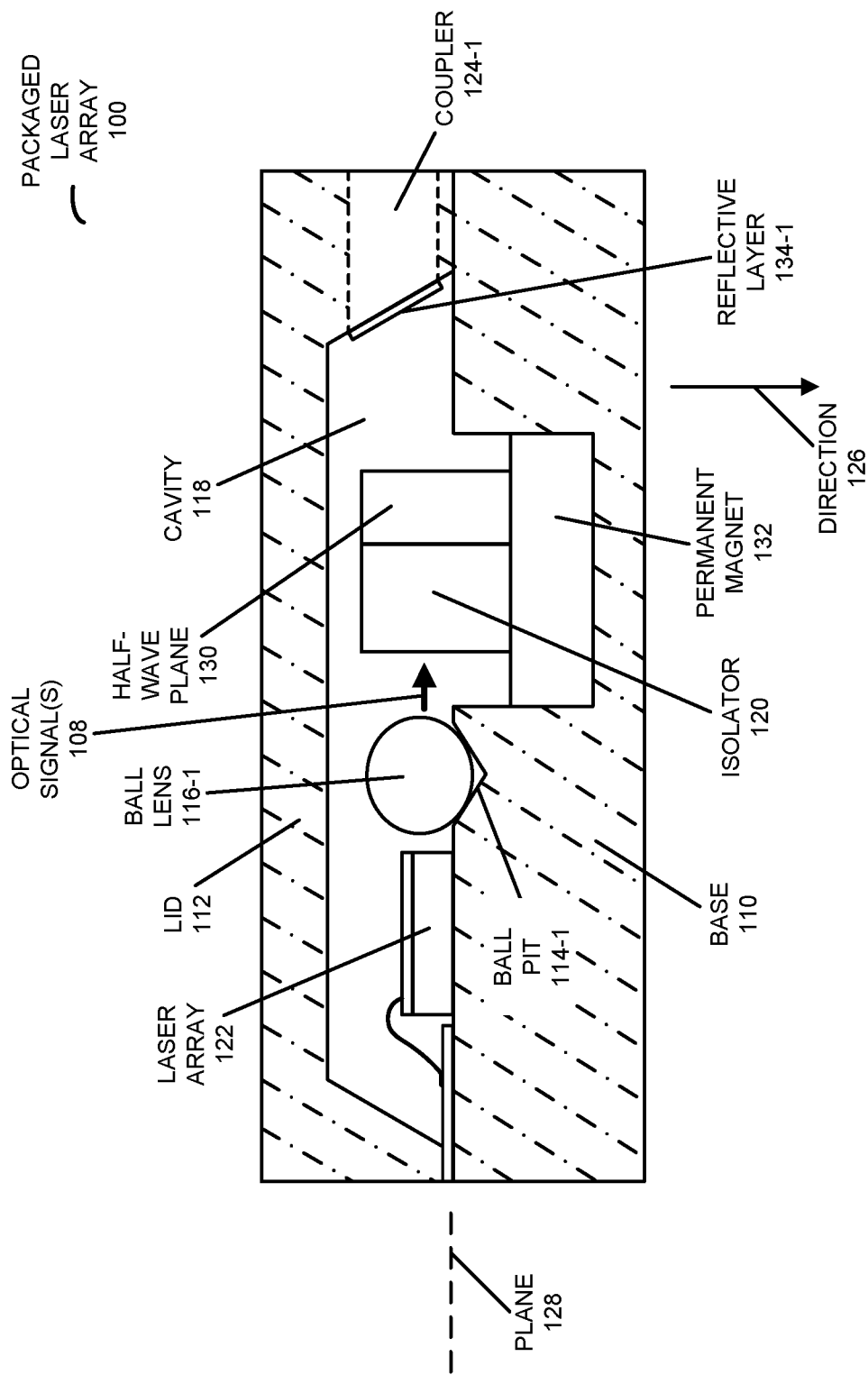
FIG. 1 is a drawing illustrating an example of a side view of a packaged laser array in accordance with an embodiment of the present disclosure.

We now describe embodiments of the packaging technique. FIG. 1 presents a drawing illustrating an example of a side view of a packaged laser array 100. In this packaged laser array, a silicon bench (which may include a silicon substrate) may be composed of a bottom base 110 and an optional top lid 112. Ball pits (such as ball pit 114-1) may be etched in silicon base 110 by, e.g., wet etching to accurately control the side-wall angle and size. Moreover, the ball pits may be populated by an array of one or more ball lenses (such as ball lens 116-1), which may include an anti-reflection coating.

Furthermore, a deep recess or cavity 118 (defined by walls or surfaces of base 110 and lid 112) may be etched in silicon base 110 by, e.g., dry etching to house an isolator 120. Note that isolator 120 typically may include an anti-reflective coating. Additionally, a III-V laser array 122 may be integrated on the silicon bench, e.g., on the left side, and output one or more optical signals 108 (such as laser beams) may be focused by the ball lens array before passing through isolator 120. In some embodiments, a coupler 124-1 is fabricated in packaged laser array 100 to couple the one or more optical signals 108 out of packaged laser array 100 (such as out of base 110).

For example, coupler 124-1 may include a reflective mirror or layer 134-1 that is fabricated on lid 112 by, e.g., wet etching to achieve accurate angle and smooth surface. Note that a metal layer may be coated on the reflective layer 134-1 to improve the reflectivity. Light reflected by reflective layer 134-1 may exit from the bottom of silicon base 110 (and, more generally, along a direction 126 that is out of plane 128. Furthermore, packaged laser array 100 may include an optional half-wave plate (HWP) 130.

Alternatively, coupler 124-1 may allow the laser array to work with an edge-coupled silicon photonic chip (e.g., base 110 may include a silicon-on-insulator or SOI chip) through an optical waveguide that terminates at an edge of the silicon photonic chip. In these embodiments, at least coupler 124-1 in lid 112 may be transparent (e.g., silicon) so that the infrared light can pass through lid 112. This approach may make packaged laser array 100 more compact because the reflective layer may not be needed.

In some embodiments, isolator 120 is preconditioned (or latched) by exposing it to an external magnetic field before integration to package laser array 100. However, the magnetic domain in isolator 120 may change and lose its functionality at high temperature during thermal reflow. In order to address this problem, an optional permanent magnet 132 (having a non-zero remnant magnetization, such as a ferromagnet, or a magnetic order, such as an antiferromagnet) may be attached or coupled at the bottom of isolator 120 to preserve the magnetism of isolator 120 during and after the thermal reflow. For example, a magnetic field associated with permanent magnet 132 may preserve or maintain the magnetization of isolator 120. Alternatively, two or more magnets may be included on both the bottom and top of isolator 120 to provide a magnetic field larger than the saturation magnetic field of the magnetic material in isolator 120. Note that embodiments with permanent magnet 132 may allow packaged laser array 100 to survive multiple reflow cycles without having to remagnetize isolator 120 when housed in large packages or on a printed-circuit electrical board. Thus, the use of permanent magnet 132 may maintain the reliability of a sensitive integrated circuit or other electrical components, which could be otherwise damaged by exposure to large remagnetizing magnetic fields following reflow(s).

For example, isolator 120 may include a first polarizer having a first polarization axis, a polarization rotator that rotates the polarization (such as a Faraday rotator), and a second polarizer having a second polarization axis that is different from the first polarization axis. This configuration of isolator 120 may be useful when the polarization of the one or more optical signals from laser array 122 is fixed (such as when laser array 122 is a silicon photonic chip or a III-V chip, e.g., an indium-phosphide chip). In some embodiments, the first polarization axis may be at 0°, the polarization rotation may be 45° and the second polarization axis may be at 45°. A back reflection that returns through this isolator will be rotated to 90° and this blocked by the first polarizer. However, in embodiments that include one or more optical waveguides that are polarization sensitive (such as one or more optical waveguides that convey the one or more optical from laser array 122) the polarization of the optical signal(s) output from isolator 120 may be further rotated by optional half-wave plate 130.

Figure 2:
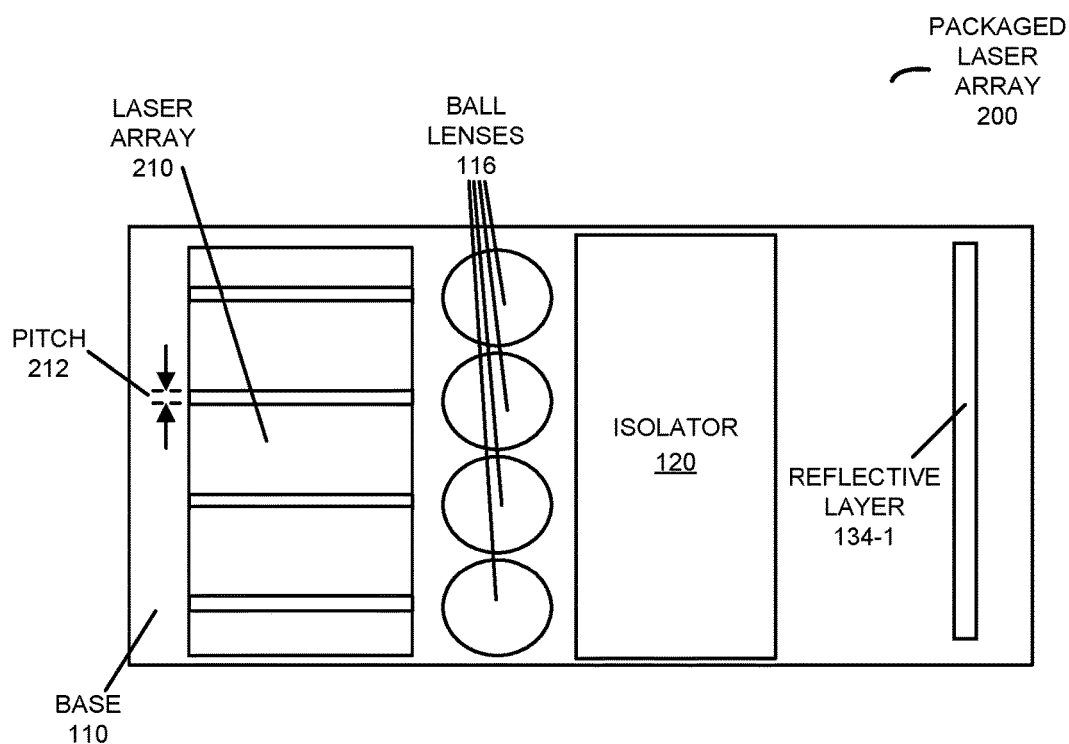
FIG. 2 is a drawing illustrating a top view of an example of a packaged laser array in accordance with an embodiment of the present disclosure.

FIG. 2 presents a drawing illustrating a top view of an example of a packaged laser array 200. This packaged laser array may include a 1×4 laser array 210. However, in some embodiments, packaged laser array 200 can be expanded to a larger size, e.g., 1×8 or 1×16 laser array. The III-V laser array 210 may be fabricated using III-V technology with high-quality and/or deterministic performance. Because the lasers in laser array 210 are fabricated in the same monolithographic operations, they may be aligned with an accurate pitch 212 (e.g., 500 μm). Moreover, the III-V laser array 210 may be passively aligned and bonded on the silicon base 110 using a high-accuracy bonder. Furthermore, the output optical signals 108 (FIG. 1) may be focused by the ball lens array 116 with a matching pitch to pitch 212.

Figure 3:
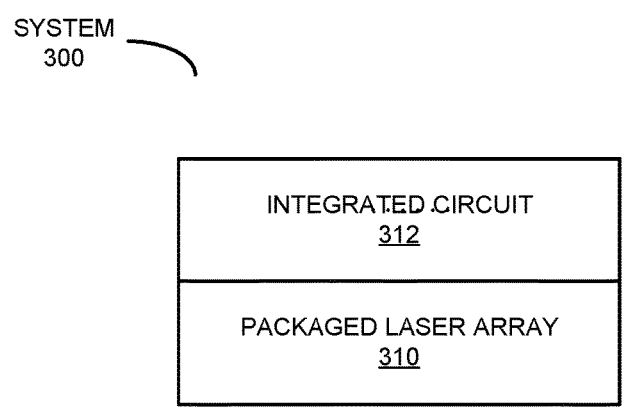
FIG. 3 is a drawing illustrating a side view of an example of a system with a packaged laser array optically coupled to an integrated circuit in accordance with an embodiment of the present disclosure.

Note that a misalignment tolerance is often an important design criterion when coupling a packaged laser array (such as packaged laser array 100 in FIG. 1 or packaged laser array 200) to a silicon chip, e.g., in order to ensure that laser array 210 has good power uniformity across the channels. A III-V laser array 210 with an expanded mode (e.g., a mode field diameter MFD equal to 3×3 μm) may be used to enable an output beam size of 20 μm. For example, as shown in FIG. 3, which presents a drawing illustrating a side view of an example of a system 300 with a packaged laser array 310 (such as packaged laser array 100 in FIG. 1 or packaged laser array 200) optically coupled to an integrated circuit 312, one or more couplers (such as reflective, refractive and/or diffractive couplers) on integrated circuit 312 (such as a silicon chip) with a matching mode size may be designed to enable low coupling loss and good misalignment tolerance. For example, the one or more couplers may optically couple the one or more optical signals 108 (FIG. 1) into the one or more optical waveguides on integrated circuit 312. With the relaxed alignment requirement, packaged laser array 310 can be light-off (passively) integrated to integrated circuit 312, which can greatly reduce the integration complexity.

Figure 4:
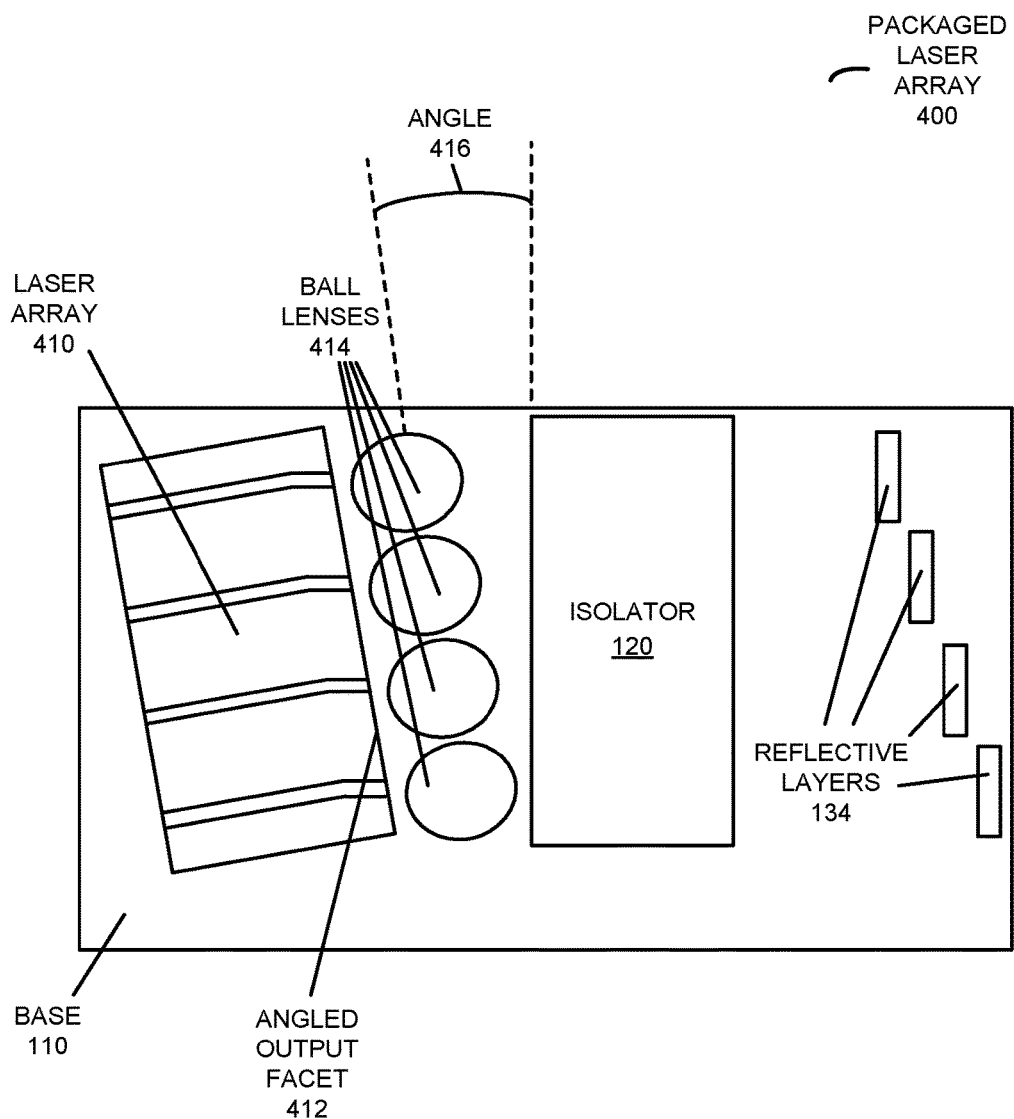
FIG. 4 is a drawing illustrating a top view of an example of a packaged laser array in accordance with an embodiment of the present disclosure.

Furthermore, reflection at the output facet of a III-V laser can cause a stability issue at high power using a straight optical waveguide even with a proper antireflection coating. In order to address this problem, an angled optical waveguide may be used. This is shown in FIG. 4, which presents a drawing illustrating a top view of an example of a packaged laser array 400. Notably, the reflection can be greatly reduced from $10^{-3}$ to $10^{-5}$ by including an angled output facet 412, which may facilitate high-power operation. In embodiments with the angled output facet 412, a ball lens array 414 may be placed with an angle 416 (such as an angle between 2.5-15° or 6-8°, e.g., 7°) to match the outputs of the III-V laser array 410. This may ensure that the channels have the same light path length. In addition, a stepped mirror array or reflective layers 134 on base 110 or lid 112 may be fabricated in order to also ensure the same or a common total optical path length for the lasers in laser array 410.

In some embodiments, a micro lens array can be used to replace the ball lenses 116 assembled in the etched precision silicon pits (such as pit 114-1 in FIG. 1). More generally, a variety of optical components and optical couplers (based on reflection, refraction and/or diffraction) may be used. Note that the micro lens array may be implemented using a refractive lens array and/or a diffractive micro-lens array.

In addition to providing low cost and high efficiency, the embodiments of the packaged laser array may provide an efficient solution for optical interconnect circuits requiring multiple light sources. The lasers in the laser array may have the same carrier or fundamental wavelength (as is often required for parallel links) or may operate at different wavelengths (as is often the case in wavelength division multiplexing or WDM links). Moreover, the III-V laser array may be tested and selected before integration into the packaged laser array, which may help improve the yield and uniformity. The reflow compatibility is another main advantage of the packaged laser array. Furthermore, as discussed previously, the permanent magnet(s) may ensure that the isolator can survive multiple thermal reflows, which may facilitate integrating the packaged laser array in more complex systems or electronic devices that involve several solder reflows after integrating the laser array. Additionally, using an angled-facet III-V laser array, the packaged laser array can also enable a packaged laser array with a stable high-power output. Note that a large beam size (e.g., 20 μm) may provide a good misalignment tolerance. Therefore, the packaging technique may facilitate passive integration with good power uniformity for the lasers in the laser array.

In summary, the embodiments of the packaged laser array may provide a high-power packaged laser array that is reflow compatible. An isolator with at least one permanent magnet attached can preserve the magnetic domain of the isolator at high temperature and, therefore, may maintain isolation during the high-temperature thermal reflows. In some embodiments, an angled-waveguide III-V laser array can be used to reduce the reflection at the facet of the lasers and to improve the power stability, especially for high-power application. Moreover, a large output laser beam size may be achieved by using expanded-mode III-V laser array with proper optical path design. This may enable passive/active alignment of the laser array to a silicon chip with low coupling loss and good power uniformity.

Note that the preceding embodiments may include additional or fewer components. For example, in some embodiments packaged laser array 100 excludes lid 112. Instead, a coupler 124-1 (such as reflective layer 134-1) may be integrated on base 110. Moreover, positions of one or more components may be changed, two or more components may be combined into a single component and/or a component may be divided into two or more components.

Figure 5:
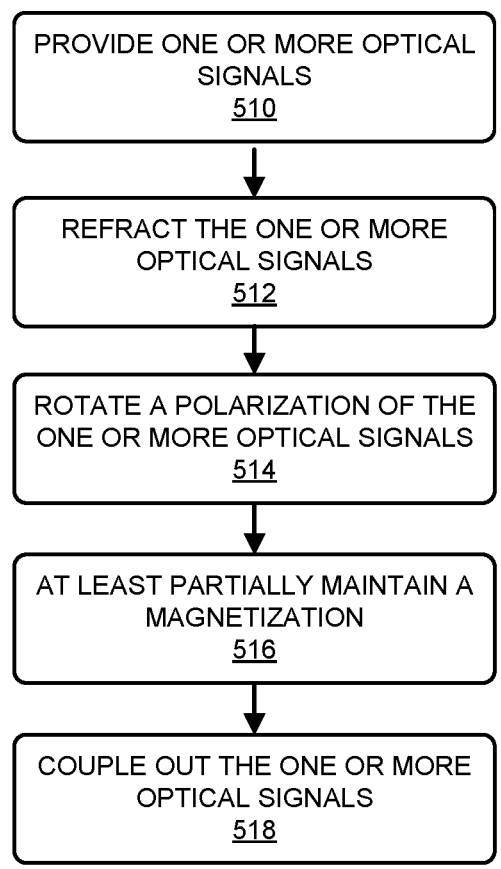
FIG. 5 is a flow diagram illustrating an example of a method for providing one or more optical signals in accordance with an embodiment of the present disclosure.

We now describe a method. FIG. 5 presents an example of a method 500 for providing one or more optical signals, which may be performed by a packaged laser array (such as one of the packaged laser array in the preceding embodiments). During operation, a laser array with one or more lasers in the packaged laser array provides the one or more optical signals (operation 510) in a plane. Then, a lens array with one or more lenses in the packaged laser array refracts the one or more optical signals (operation 512). Moreover, an isolator in the packaged laser array rotates a polarization of the one or more optical signals (operation 514). Furthermore, a permanent magnet proximate to the isolator in the packaged laser array at least partially maintains the magnetization (operation 516). Next, one or more couplers in the packaged laser array reflects the one or more optical signals (operation 518) along a direction out of the packaged laser array.

For example, as described previously, the packaged laser array may include: the substrate, a laser array with one or more lasers disposed on a surface of the substrate, a lens array with one or more lenses disposed on the surface, an isolator having a magnetization that rotates a polarization of the one or more optical signals, a permanent magnet proximate (such as adjacent, e.g., within 1 mm) to the isolator that at least partially maintains a magnetization of the isolator, and one or more couplers that couple the one or more optical signals along the direction out of the substrate. Note that 'partially maintaining' may be defined to mean maintaining 25, 50, 75, 85 or 95% of the remnant magnetization prior to an instance of thermal reflow, and 'approximately perpendicular' may be defined to mean with 5, 10 or 20° of normal.

In some embodiments, the laser array includes an external laser array on a different substrate that the substrate, which is coupled to the surface of the substrate. For example, the laser array may include a III-V semiconductor laser array.

Moreover, the one or more lenses may include one or more ball lenses that are disposed in one or more corresponding pits in the surface.

Furthermore, the packaged laser array may include a half-wave plate between the isolator and the one or more couplers.

Additionally, the permanent magnet may maintain the magnetization of the isolator during thermal reflow at a temperature exceeding a threshold value (such as 200 C).

In some embodiments, the one or more optical signals have an optical beam size greater than a second threshold value (such as greater than 1-5 μm).

Moreover, the one or more lasers may have angled facets. In these embodiments, the lens array may be arranged with an angle corresponding the angled facets and the one or more couplers may be positioned based at least in part on the angled facets so that the one or more optical signals have approximately a common optical path length in the packaged laser array.

Furthermore, the one or more optical signals may have the same or different carrier or fundamental wavelengths.

In some embodiments of method 500, there may be additional or fewer operations. Moreover, the order of the operations may be changed, and/or two or more operations may be combined into a single operation.

Figure 6:
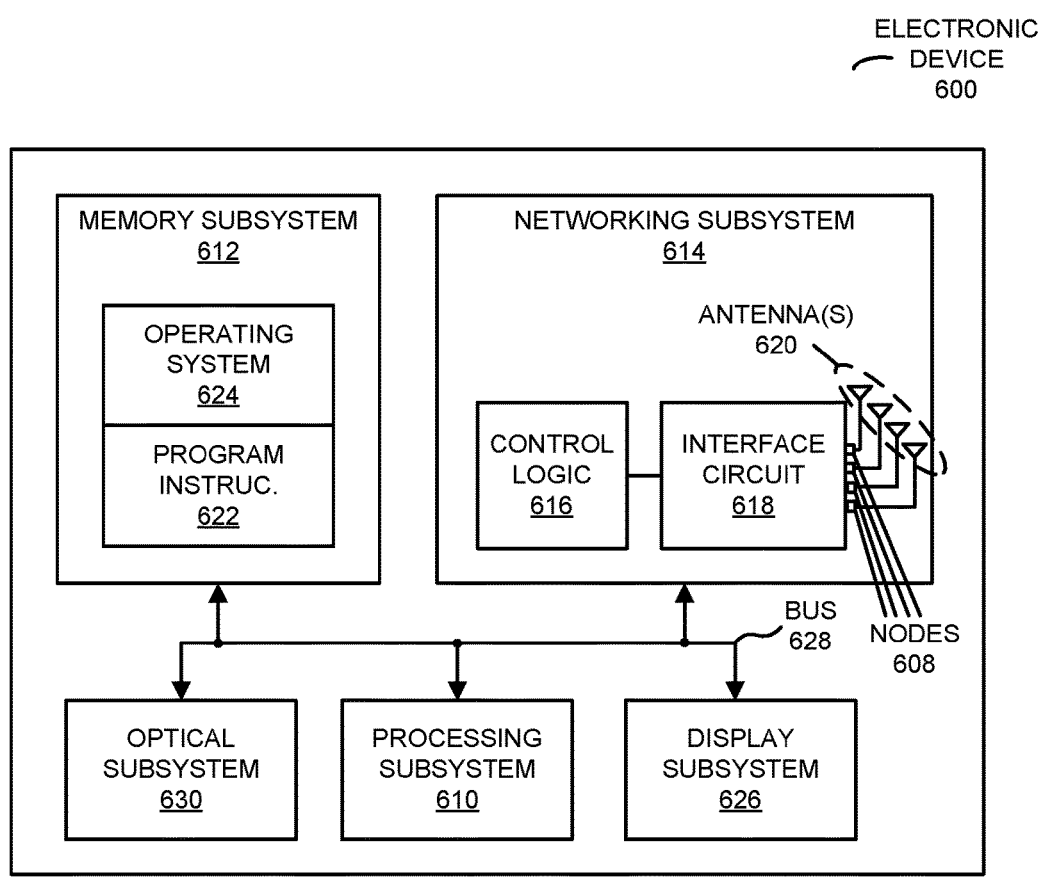
FIG. 6 is a block diagram illustrating an example of an electronic device in accordance with an embodiment of the present disclosure.

We now describe embodiments of an electronic device, which may include a packaged laser array. FIG. 6 presents a block diagram illustrating an example of an electronic device 600 (or one or more electronic devices) in accordance with some embodiments. This electronic device includes processing subsystem 610, memory subsystem 612, and networking subsystem 614. Note that one or more of these subsystems may include at least an instance of one of the previous embodiments of the packaged laser array. Alternatively or additionally, electronic device 600 may optionally include one or more instances of the packaged laser array in another component, such as optional optical subsystem 630.

Processing subsystem 610 includes one or more devices configured to perform computational operations. For example, processing subsystem 610 can include one or more: microprocessors, ASICs, microcontrollers, programmable-logic devices, graphics processing units (GPUs) and/or digital signal processors (DSPs).

Memory subsystem 612 includes one or more devices for storing data and/or instructions for processing subsystem 610 and networking subsystem 614. For example, memory subsystem 612 can include dynamic random access memory (DRAM), static random access memory (SRAM), and/or other types of memory. In some embodiments, instructions for processing subsystem 610 in memory subsystem 612 include: one or more program instructions or sets of instructions (such as program instructions 622 or operating system 624), which may be executed by processing subsystem 610. Note that the one or more computer programs may constitute a computer-program mechanism. Moreover, instructions in the various modules in memory subsystem 612 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 610.

In addition, memory subsystem 612 can include mechanisms (such as a circuit or software) for controlling access to the memory. In some embodiments, memory subsystem 612 includes a memory hierarchy that comprises one or more caches coupled to a memory in electronic device 600. In some of these embodiments, one or more of the caches is located in processing subsystem 610.

In some embodiments, memory subsystem 612 is coupled to one or more high-capacity mass-storage devices (not shown). For example, memory subsystem 612 can be coupled to a magnetic or optical drive, a solid-state drive, or another type of mass-storage device. In these embodiments, memory subsystem 612 can be used by electronic device 600 as fast-access storage for often-used data, while the mass-storage device is used to store less frequently used data.

Networking subsystem 614 includes one or more devices configured to couple to and communicate on an optical, a wired and/or wireless network (e.g., to perform network operations), including: control logic 616, an interface circuit 618 and one or more optional antennas 620 (or antenna elements). (While FIG. 6 includes one or more antennas 620, in some embodiments electronic device 600 includes one or more nodes, such as nodes 608, e.g., a pad, which can be coupled to the one or more antennas 620. Thus, electronic device 600 may or may not include the one or more antennas 620.) For example, networking subsystem 614 can include a Bluetooth™ networking subsystem, a cellular networking subsystem (e.g., a 3G/4G/5G network such as UMTS, LTE, etc.), a universal serial bus (USB) networking subsystem, a networking subsystem based on the standards described in IEEE 802.11 (e.g., a Wi-Fi® networking system), an Ethernet networking subsystem, and/or another networking subsystem.

Networking subsystem 614 includes processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for the network system. Moreover, in some embodiments a 'network' or a 'connection' between the electronic devices does not yet exist. Therefore, electronic device 600 may use networking subsystem 614 for performing simple wireless communication, e.g., transmitting advertising or beacon frames and/or scanning for advertising frames transmitted by other electronic devices.

Within electronic device 600, processing subsystem 610, memory subsystem 612, networking subsystem 614 and optional optical subsystem 630 are coupled together using signal lines, links or bus 628. These connections may include an electrical, optical, and/or electro-optical connection that the subsystems can use to communicate signals, commands and data among one another.

Furthermore, while some components are shown directly connected to one another in FIG. 6, in general coupling can also occur via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used. Although only one bus 628 (or one or more signal lines) is shown for clarity in FIG. 6, different embodiments can include a different number or configuration of electrical, optical, and/or electro-optical connections among the subsystems.

In some embodiments, electronic device 600 includes a display subsystem 626 for displaying information on a display, which may include a display driver and the display, such as a liquid-crystal display, a multi-touch touchscreen, etc.

Electronic device 600 and/or an instance of the packaged laser array may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, electronic device 600 and/or an instance of the packaged laser array may include, but is not limited to: a desktop computer, a server (such as a multi-socket, multi-rack server), a laptop computer, a communication device or system, an access point, a router, a switch, communication equipment, a controller, test equipment, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a smartwatch, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, a sensor (such as a LIDAR sensor), an automobile or a truck, another electronic device, a laser (such as a hybrid laser and/or another optical component).

Although specific components are used to describe electronic device 600, in alternative embodiments, different components and/or subsystems may be present in electronic device 600. For example, electronic device 600 may include one or more additional processing subsystems, memory subsystems, networking subsystems, display subsystems and/or one or more additional subsystems not shown in FIG. 6 (such as a user-input subsystem). Additionally, one or more of the subsystems may not be present in electronic device 600. Also, although separate subsystems are shown in FIG. 6, in some embodiments some or all of a given subsystem or component can be moved or integrated into one or more of the other subsystems or component(s) in electronic device 600. For example, in some embodiments program instructions 622 are included in operating system 624 and/or control logic 616 is included in interface circuit 618. Thus, while electronic device 600, as well as the previous embodiments of the packaged laser array, are illustrated as having a number of discrete items, these components are intended to be functional descriptions of the various features that may be present rather than structural schematics of the embodiments described herein.

Moreover, the circuits and components in electronic device 600 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit (which is sometimes referred to as a 'communication circuit') may implement some or all of the functionality of electronic device 600. In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on the computer-readable medium. Those of skill in the art of integrated circuit fabrication can use such encoded data to fabricate integrated circuits that include one or more of the circuits described herein.

In some embodiments, the integrated circuit may be implemented using a CMOS technology. Alternatively, the integrated circuit may be implemented using an SOI technology or platform. This integrated circuit may include a substrate and a buried-oxide (BOX) layer disposed on the substrate. Moreover, a semiconductor layer may be disposed on BOX layer, where the semiconductor layer, at least in part, includes an optical waveguide. Thus, the substrate may include silicon, the BOX layer may include silicon dioxide, and the semiconductor layer may include silicon. Alternatively, in other embodiments, dielectric optical waveguides are used, i.e. where the starting wafer is a blank silicon wafer with only the lower cladding layer deposited.

However, a wide variety of materials may be used to implement the integrated circuit, the packaged laser array and/or the optical waveguide, including: SOI, a semiconductor (e.g., indium phosphide, aluminum gallium arsenide, aluminum gallium nitride arsenide, aluminum gallium arsenide phosphide, a III-V compound semiconductor, etc.), and/or an insulator optical waveguide (e.g., silicon dioxide or silicon nitride). For example, the packaged laser array may include a substrate that is an insulator. Consequently, the semiconductor layer and/or the integrated circuit may include: silicon, silicon dioxide, and/or silicon nitride. Thus, while a silicon was illustrated in the preceding embodiments, the packaging technique may be used with other materials (such as germanium, silicon germanium, another semiconductor, glass and/or plastic), as is known to one of skill in the art. More generally, the packaged laser array and/or the integrated circuit may be implemented using a variety of integrated optical waveguide technologies.

In some embodiments, the fundamental or carrier wavelength of an optical signal in the optical waveguide and/or the packaged laser array is, e.g., between 1.1-1.7 µm. For example, the optical signal may have a fundamental or a carrier wavelength of 1.3 or 1.55 µm. Moreover, the semiconductor layer may have a thickness that is, e.g., less than 1 µm (such as 0.2-0.5 µm). Furthermore, the semiconductor layer may have a thickness, e.g., of 0.3 µm. Additionally, the BOX layer may have a thickness, e.g., between 0.3 and 3 µm (such as 0.8 µm).

While some of the operations in the preceding embodiments were implemented in hardware or software, in general the operations in the preceding embodiments can be implemented in a wide variety of configurations and architectures, such as by one or more: ASICs, FPGAs, DPSs, GPUs, etc. Therefore, some or all of the operations in the preceding embodiments may be performed in hardware, in software or both. For example, at least some of the operations in the communication technique may be implemented using program instructions 622, operating system 624 (such as a driver for interface circuit 618) or in firmware in interface circuit 618 or optional optical subsystem 630. Alternatively or additionally, at least some of the operations in the communication technique may be implemented in a physical layer, such as hardware in interface circuit 618 or optional optical subsystem 630. In general, electronic device 600 may be at one location or may be distributed over multiple, geographically dispersed locations.

Moreover, the preceding embodiments of the packaged laser array and/or electronic device 600 can be used in a wide variety of applications, such as: communications (for example, in a transceiver, an optical source (such as a laser), an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

While the preceding embodiments have been illustrated with particular elements and compounds, a wide variety of materials and compositions (including stoichiometric and non-stoichiometric compositions) may be used, as is known to one of skill in the art. Furthermore, the materials and compounds in the embodiments of the packaged laser array and/or optional optical subsystem 630 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with one or more of the embodiments of the packaged laser array and/or optional optical subsystem 630. Furthermore, a wide variety of optical sources may be integrated with or included in one or more of the embodiments of the packaged laser array and/or optional optical subsystem 630, including many different types of lasers (lasers that are fabricated using materials other than III-V semiconductors) or non-laser optical sources (such as a light-emitting diode).

Moreover, while the preceding discussion included some numerical values, these values are for purposes of illustration and are not intended to be limiting. In other embodiments, different numerical values may be used.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A packaged laser array, comprising:
   a substrate having a surface;
   a laser array, with one or more lasers, disposed on the surface, wherein the one or more lasers are configured to output one or more optical signals in a plane;
   a lens array, with one or more lenses, disposed on the surface, wherein the one or more lenses are configured to refract the one or more optical signals;
   an isolator, having a magnetization, configured to rotate a polarization of the one or more optical signals;
   a permanent magnet, proximate to the isolator, configured to at least partially maintain the magnetization, wherein the permanent magnet has a non-zero remnant magnetization and is configured to maintain the magnetization of the isolator during thermal reflow of the packaged laser array without subsequent remagnetization of the isolator by providing an external magnetic field exceeding a saturation magnetic field of the magnetization in the isolator at a temperature exceeding 200 C; and
   one or more couplers configured to couple the one or more optical signals out of the packaged laser array.

2. The packaged laser array of claim 1, wherein the one or more couplers include one or more reflective layers and the one or more optical signals are coupled along a direction that is approximately perpendicular to the plane.

3. The packaged laser array of claim 1, wherein the laser array comprises an external laser array on a different substrate that the substrate, which is coupled to the surface of the substrate.

4. The packaged laser array of claim 1, wherein the one or more lenses comprises one or more ball lenses that are disposed in one or more corresponding pits in the surface.

5. The packaged laser array of claim 1, wherein the packaged laser array comprises a half-wave plate between the isolator and the one or more couplers.

6. The packaged laser array of claim 1, wherein the one or more optical signals have an optical beam size greater than 1 µm.

7. The packaged laser array of claim 1, wherein the one or more lasers have angled facets.

8. The packaged laser array of claim 7, wherein the lens array is arranged with an angle corresponding the angled facets and the one or more couplers are positioned based at least in part on the angled facets so that the one or more optical signals have approximately a common optical path length in the packaged laser array.

9. The packaged laser array of claim 1, wherein the one or more optical signals have different carrier or fundamental wavelengths.

10. An electronic device, comprising a packaged laser array, wherein the packaged laser array comprises:
    a substrate having a surface;
    a laser array, with one or more lasers, disposed on the surface, wherein the one or more lasers are configured to output one or more optical signals in a plane;
    a lens array, with one or more lenses, disposed on the surface, wherein the one or more lenses are configured to refract the one or more optical signals;

an isolator, having a magnetization, configured to rotate a polarization of the one or more optical signals;

a permanent magnet, proximate to the isolator, configured to at least partially maintain the magnetization, wherein the permanent magnet has a non-zero remnant magnetization and is configured to maintain the magnetization of the isolator during thermal reflow of the packaged laser array without subsequent remagnetization of the isolator by providing an external magnetic field exceeding a saturation magnetic field of the magnetization in the isolator at a temperature exceeding 200 C; and one or more couplers configured to couple the one or more optical signals out of the packaged laser array.

11. The electronic device of claim 10, wherein the laser array comprises an external laser array on a different substrate that the substrate, which is coupled to the surface of the substrate.

12. The electronic device of claim 10, wherein the packaged laser array comprises a half-wave plate between the isolator and the one or more couplers.

13. The electronic device of claim 10, wherein the one or more optical signals have an optical beam size greater than 1 µm.

14. The electronic device of claim 10, wherein the electronic device comprises an integrated circuit that includes one or more optical waveguides and one or more couplers configured to optically couple the one or more optical signals into the one or more optical waveguides.

15. The electronic device of claim 10, wherein the one or more lasers have angled facets.

16. The electronic device of claim 15, wherein the lens array is arranged with an angle corresponding the angled facets and the one or more couplers are positioned based at least in part on the angled facets so that the one or more optical signals have approximately a common optical path length in the packaged laser array.

17. A method for providing one or more optical signals, comprising:

by a packaged laser array:

providing the one or more optical signals in a plane using a laser array with one or more lasers;

refracting the one or more optical signals using a lens array with one or more lenses;

rotating a polarization of the one or more optical signals using an isolator having a magnetization;

at least partially maintaining the magnetization using a permanent magnet, proximate to the isolator, wherein the permanent magnet has a non-zero remnant magnetization and maintains the magnetization of the isolator during thermal reflow of the packaged laser array without subsequent remagnetization of the isolator by providing an external magnetic field exceeding a saturation magnetic field of the magnetization in the isolator at a temperature exceeding 200 C; and coupling the one or more optical signals along a direction out of the packaged laser array using one or more couplers.

18. The method of claim 17, wherein the one or more couplers include one or more reflective layers and the one or more optical signals are coupled along a direction that is approximately perpendicular to the plane.

19. The method of claim 17, wherein the laser array comprises an external laser array on a different substrate that the substrate, which is coupled to the surface of the substrate.

20. The method of claim 17, wherein the packaged laser array comprises a half-wave plate between the isolator and the one or more couplers.

* * * * *